United States Patent
Andriessen

(10) Patent No.: US 7,867,572 B2
(45) Date of Patent: Jan. 11, 2011

(54) METHOD FOR MAKING A LITHOGRAPHIC PRINTING PLATE PRECURSOR

(75) Inventor: Hieronymus Andriessen, Beerse (BE)

(73) Assignee: Agfa Graphics NV, Mortsel (BG)

( * ) Notice: Subject to any disclaimer, the term of this patent is extended or adjusted under 35 U.S.C. 154(b) by 0 days.

(21) Appl. No.: 12/090,667

(22) PCT Filed: Oct. 13, 2006

(86) PCT No.: PCT/EP2006/067365

§ 371 (c)(1),
(2), (4) Date: Apr. 18, 2008

(87) PCT Pub. No.: WO2007/045607

PCT Pub. Date: Apr. 26, 2007

(65) Prior Publication Data

US 2008/0268160 A1 Oct. 30, 2008

Related U.S. Application Data

(60) Provisional application No. 60/736,046, filed on Nov. 10, 2005.

(30) Foreign Application Priority Data

Oct. 20, 2005 (EP) .................................. 05109782

(51) Int. Cl.
*B05D 3/02* (2006.01)
(52) U.S. Cl. ................. 427/385.5; 427/372.2; 427/195; 427/375
(58) Field of Classification Search ............... 427/385.5
See application file for complete search history.

(56) References Cited

U.S. PATENT DOCUMENTS

| 4,980,025 | A | * | 12/1990 | Andersson et al. | ........ 162/168.3 |
| 5,445,912 | A | * | 8/1995 | Hauquier et al. | ............ 430/159 |
| 2002/0009574 | A1 | | 1/2002 | Hiraoka | |
| 2002/0051931 | A1 | | 5/2002 | Mori et al. | |
| 2002/0168582 | A1 | * | 11/2002 | Vermeersch et al. | ..... 430/270.1 |
| 2003/0136284 | A1 | * | 7/2003 | Aert et al. | ................. 101/450.1 |
| 2004/0081913 | A1 | | 4/2004 | Mori | |
| 2005/0130062 | A1 | * | 6/2005 | Mori | ....................... 430/270.1 |

FOREIGN PATENT DOCUMENTS

| EP | 0 849 090 A2 | 6/1998 |
| JP | 2004-195724 A | 7/2004 |
| WO | 03/010006 A1 | 2/2003 |

OTHER PUBLICATIONS

Vermeersch, J. "Research Disclosure No. 33303" Jan. 1992.*
Official communication issued in the International Application No. PCT/EP2006/067365, mailed on Jan. 30, 2007.

* cited by examiner

*Primary Examiner*—Michael Barr
*Assistant Examiner*—Robert S Walters, Jr.
(74) *Attorney, Agent, or Firm*—Keating & Bennett, LLP

(57) ABSTRACT

A method for making a lithographic printing plate precursor includes the steps of
coating a composition having a pH≦5 on a support having a hydrophilic surface or which is provided with a hydrophilic layer, the composition including hydrophobic thermoplastic polymer particles stabilized with an anionic dispersant, a hydrophilic binder and colloidal silica, characterized in that the silica carries a negative charge; and
drying the coated composition.

19 Claims, No Drawings

METHOD FOR MAKING A LITHOGRAPHIC PRINTING PLATE PRECURSOR

CROSS-REFERENCE TO RELATED APPLICATIONS

This application is a 371 of PCT/EP2006/067365, filed Oct. 13, 2006. This application claims the benefit of U.S. Provisional Application No. 60/736,046, filed Nov. 10, 2005, which is incorporated by reference herein in its entirety. In addition, this application claims the benefit of European Application No. 05109782.2, filed Oct. 20, 2005, which is also incorporated by reference herein in its entirety.

BACKGROUND OF THE INVENTION

1. Field of the Invention

The present invention relates to a method for making a heat-sensitive, negative-working lithographic printing plate precursor.

2. Description of the Related Art

Lithographic printing presses use a so-called printing master such as a printing plate which is mounted on a cylinder of the printing press. The master carries a lithographic image on its surface and a print is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e., ink-accepting, water-repelling) areas as well as hydrophilic (or oleophobic, i.e., water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the image-wise exposure and processing of an imaging material called a plate precursor. In addition to the well-known photosensitive, so-called pre-sensitized plates, which are suitable for UV contact exposure through a film mask, heat-sensitive printing plate precursors have also become very popular in the late 1990s. Such thermal materials offer the advantage of daylight stability and are especially used in the so-called computer-to-plate method wherein the plate precursor is directly exposed, i.e., without the use of a film mask. The material is exposed to heat or to infrared light and the generated heat triggers a (physico-) chemical process, such as ablation, polymerization, insolubilization by crosslinking of a polymer, heat-induced solubilization, or by particle coagulation of a thermoplastic polymer latex.

The most popular thermal plates form an image by a heat-induced solubility difference in an alkaline developer between exposed and non-exposed areas of the coating. The coating typically includes an oleophilic binder, e.g., a phenolic resin, of which the rate of dissolution in the developer is either reduced (negative working) or increased (positive working), by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in, e.g., EP-A 625728, EP-A 823327, EP-A 825927, EP-A 864420, EP-A 894622, and EP-A 901902. Negative working embodiments of such thermal materials often require a pre-heat step between exposure and development as described in, e.g., EP-A 625,728.

Negative working plate precursors which do not require a pre-heat step may contain an image-recording layer that works by heat-induced particle coalescence of a thermoplastic polymer latex, as described in, e.g., EP-A 770 494, EP-A 770 495, EP-A 770 496, and EP-A 770 497. These patents disclose a method for making a lithographic printing plate including the steps of (1) image-wise exposing an imaging element including hydrophobic thermoplastic polymer particles dispersed in a hydrophilic binder and a compound capable of converting light into heat, (2) and developing the image-wise exposed element by applying fountain solution and/or ink.

U.S. 2002/0009574, U.S. 2002/0051931, and U.S. 2004/0081913 disclose a printing plate precursor including a hydrophilic layer on a metal or flexible support and an imaging layer including heat-fusible particles dispersed in a hydrophilic binder, wherein the hydrophilic layer includes colloidal silica as a porosity providing material.

EP 849 090 discloses an imaging element including on a flexible support (i) an ink repellant layer containing a crosslinked hydrophilic binder, (ii) a thermosensitive layer including hydrophobic thermoplastic polymer particles dispersed in a hydrophilic binder, and (iii) an outermost layer including a hydrophilic binder and optionally colloidal silica.

U.S. 2002/0051931 discloses a printing plate precursor including an imaging layer including latex particles which may also contain alkaline colloidal silica.

Research Disclosure No. 33303 dated January, 1992 discloses a heat recording material including on a support a hydrophilic layer containing a hydrophilic binder, a tetraalkyl orthosilicate crosslinking agent, and hydrophobic thermoplastic polymer particles. The hydrophilic layer may further include colloidal silica for improving the mechanical strength and porosity of the layer.

JP 2004/195724 discloses a lithographic printing plate precursor with an imaging layer including on a flexible support an image-forming layer including latex particles dispersed in a hydrophilic binder and colloidal silica.

Plate precursors that work according to the mechanism of heat-induced latex coalescence preferably have a high sensitivity enabling exposure at a low energy density and good clean-out characteristics, i.e., complete removal of unexposed areas during development. However, often high sensitivity printing plates which only require a low energy density to induce coalescence of the latex particles show an insufficient clean-out during development resulting in toning (i.e., ink acceptance in the non-image areas). Attempts in the prior art for improving clean-out behavior of latex based printing plates usually at the same time reduce the sensitivity of the plate.

SUMMARY OF THE INVENTION

In order to overcome the problems described above, preferred embodiments of the present invention provide a method for making a high sensitivity printing plate that works by heat-induced coalescence of thermoplastic polymer particles and that exhibits an excellent clean-out behavior.

According to a preferred embodiment of the present invention, a method for making a negative-working printing plate precursor includes the steps of coating a composition having a pH$\leq$5 on a support, the composition including hydrophobic thermoplastic polymer particles stabilized with an anionic dispersant, a hydrophilic binder, and colloidal silica, wherein the silica carries a negative charge; and drying the coated composition.

Other features, elements, steps, characteristics and advantages of the present invention will become more apparent from the following detailed description of preferred embodiments thereof.

DETAILED DESCRIPTION OF PREFERRED EMBODIMENTS

The coating of the printing plate precursor according to a preferred embodiment of the present invention includes hydrophobic thermoplastic particles. The coating may include one or more layer(s), wherein the layer including the hydrophobic thermoplastic particles is referred to herein as the "image-recording layer". The hydrophobic particles preferably have a number average particle diameter below 200 nm, more preferably between 10 and 100 nm. In a preferred embodiment, the average particle size is between 40 nm and 70 nm, more preferably between 45 nm and 65 nm. The particle size is defined herein as the particle diameter, measured by Photon Correlation Spectrometry, also known as Quasi-Elastic or Dynamic Light-Scattering. This technique produces values of the particle size that match well with the particle size measured with transmission electronic microscopy (TEM) as disclosed by Stanley D. Duke et al. in Calibration of Spherical Particles by Light Scattering, in Technical Note-002B, May 15, 2000 (revised Jan. 3, 2000 from a paper published in Particulate Science and Technology 7, pp. 223-228 (1989)).

The amount of hydrophobic thermoplastic polymer particles contained in the coating is preferably between 20 and 90 percent by weight (wt. %), relative to the weight of all the components in the coating. In a preferred embodiment, the amount of hydrophobic thermoplastic polymer particles present in the coating is at least 70 wt. % and more preferably at least 75 wt. %. An amount between 70 and 85 wt. % produces excellent results.

The hydrophobic thermoplastic polymer particles which are present in the coating are preferably selected from polyethylene, poly(vinyl)chloride, polymethyl(meth)acrylate, polyethyl(meth)acrylate, polyvinylidene chloride, poly(meth)acrylonitrile, polyvinylcarbazole, polystyrene or copolymers thereof. In order to obtain sufficient resistivity towards organic chemicals such as hydrocarbons used in plate cleaners, the thermoplastic polymer particles preferably include at least 5% by weight of nitrogen containing units as described in EP 1,219,416, more preferably at least 30% by weight of nitrogen containing units, such as (meth)acrylonitrile. According to a preferred embodiment, the thermoplastic polymer particles include polystyrene or derivatives thereof, mixtures including polystyrene and poly(meth)acrylonitrile or derivatives thereof, or copolymers including polystyrene and poly(meth)acrylonitrile or derivatives thereof. The latter copolymers may include at least 50% by weight of polystyrene, and more preferably at least 65% by weight of polystyrene. According to another preferred embodiment, the thermoplastic polymer particles consist essentially of styrene and acrylonitrile units in a weight ratio between 1:1 and 5:1 (styrene:acrylonitrile), e.g., in a 2:1 ratio.

The weight average molecular weight of the thermoplastic polymer particles may range from 5,000 to 1,000,000 g/mol.

The hydrophobic thermoplastic polymer particles according to a preferred embodiment of the present invention can be prepared by addition polymerization or by condensation polymerization. They are preferably applied onto the lithographic base in the form of a dispersion in an aqueous coating liquid. These water based dispersions can be prepared by polymerization in a water-based system, e.g., by free-radical emulsion polymerization as described in U.S. Pat. No. 3,476,937 or EP 1,217,010 or by dispersing techniques of the water-insoluble polymers into water. Another method that is suitable for preparing an aqueous dispersion of the thermoplastic polymer particles includes dissolving the hydrophobic thermoplastic polymer in an organic water immiscible solvent, dispersing the thus obtained solution in water or in an aqueous medium, and removing the organic solvent by evaporation.

Emulsion polymerization is typically carried out through controlled addition of several components, i.e., vinyl monomers, surfactants (dispersion aids), initiators and optionally other components such as buffers or protective colloids, to a continuous medium, usually water. The result of the emulsion polymerization is a dispersion of discrete polymer particles in water. The surfactants or dispersion aids which are present in the reaction medium have multiple roles in the emulsion polymerization: (i) they reduce the interfacial tension between the monomers and the aqueous phase, (ii) they provide reaction sites through micelle formation in which the polymerization occurs, and (iii) they stabilize the growing polymer particles and ultimately the latex emulsion. The surfactants are absorbed at the water/polymer interface and thereby prevent coagulation of the fine polymer particles. Both non-ionic and anionic surfactants are preferably used in emulsion polymerization.

In a preferred embodiment of the present invention anionic dispersion aids are used; they are absorbed on the latex particle and surround the particle with a charged double layer deriving from their anionic end groups and the positively charged counterions. This double layer on the surface of the polymer particles provides an energy barrier which stabilizes the emulsion by preventing coagulation of the particles. The dispersion aid is preferably represented by $R'—SO_4^-X^+$, $R''—SO_3^-X^+$, $R'''—PO_4H^-X^+$ wherein R', R" and R'" independently represent a straight or branched alkyl group having at least 10 carbon atoms, an aryl or heteroaryl group substituted with at least one straight or branched alkyl group having at least 10 carbon atoms or a polyether group which includes at least one straight or branched alkyl group having at least 10 carbon such as an alkyl substituted polyalkylene-oxide group, and $X^+$ represents a cation such as $Na^+$ or $NH4^+$. The polyalkylene-oxide group may include a plurality of alkylene-oxide recurring units of the formula $—C_nH_{2n}—O—$ wherein n is preferably an integer in the range of 2 to 5. Preferred alkylene-oxide recurring units are typically ethylene oxide, propylene oxide or mixtures thereof. The number of the recurring units range preferably between 2 and 10 units, more preferably between 2 and 5 units, and preferably less than 100, more preferably less than 60. Specific examples of suitable anionic dispersion aids include sodium lauryl sulphate, sodium lauryl ether sulphate, sodium dodecylbenzene sulphonate, and sodium lauryl phosphate.

The pH of the aqueous coating composition used in a preferred embodiment of the present invention is $\leq 5$, more preferably $\leq 4.5$, and even more preferably $\leq 4$. The electrical charge of both the colloidal silica and the latex particles which are stabilized with an anionic dispersion aid is negative at a $pH \leq 5$, and therefore a stable composition is obtained. The stability of anionic colloidal silica particles strongly depends on the pH of the dispersion. Unmodified anionic silicas are stable dispersions within a pH range from approximately 9 to 11. Above or below this pH range these dispersions become unstable. When such dispersions are added to an acidic coating solution, there is a high risk of gelation of the silica. This gelation may further result in a reduced latex stability and/or coagulation of latex particles leading to a bad clean-out and/or toning. Through surface modification of colloidal silicas with for example, aluminum silicate, such anionic dispersions become stable down to a pH of approximately 2.5. When such silicas are added to an acidic coating solution, the silica dispersion remains stable and there is no risk of the gelation phenomenon as discussed above.

According to a preferred embodiment of the present invention, it was surprisingly discovered that a printing plate precursor, prepared by applying a coating composition having a pH≦5 and which includes an acidic dispersion (pH=2.5 to 5) of anionic colloidal silica onto a support and then drying the obtained precursor, shows a significantly improved clean-out behavior while its sensitivity is not affected. By applying a coating composition having a pH≦5 and including such an acidic dispersion of anionic colloidal silica there is no risk of gelation of the colloidal silica and/or coagulation of latex particles. Suitable examples of acidic dispersions of anionic colloidal silicas include SNOWTEX O-type colloidal silicas available from Nissan Chemical such as SNOWTEX ST-O, SNOWTEX ST-OL, SNOWTEX ST-PS-MO, SNOWTEX ST-PS-SO, SNOWTEX ST-OUP, SNOWTEX-ST-UP; or LEVASIL 200E available form H.C. Starck GmbH c/o Bayer AG.

The image-recording layer further includes a hydrophilic binder which is preferably soluble in an aqueous developer having a pH≧10. Examples of suitable hydrophilic binders are homopolymers and copolymers of vinyl alcohol, acrylamide, methylol acrylamide, methylol methacrylamide, acrylic acid, methacrylic acid, hydroxyethyl acrylate, hydroxyethyl methacrylate, and maleic anhydride/vinylmethylether copolymers.

The colloidal silica according to a preferred embodiment of the present invention may be present in the image-recording layer and/or in a separate layer on top of the image-recording layer. In the preferred embodiment wherein the coating includes a separate top layer including the colloidal silica, the image-recording layer may include a tetra-alkyl orthosilicate crosslinking agent such as hydrolyzed tetraethyl orthosilicate and hydrolyzed tetramethyl orthosilicate. The amount of the tetra-alkyl orthosilicate crosslinking agent is preferably at least 0.2 parts by weight per part by weight of binder, more preferably between 0.5 and 5 parts by weight, even more preferably 1.5 parts by weight.

The colloidal silica is preferably present in the coating in an amount ranging from 0.005 to 1 g/m$^2$, more preferably in an amount ranging from 0.01 to 0.8 g/m$^2$, even more preferably in an amount ranging from 0.02 to 0.5 mg/m$^2$.

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate including an aluminum foil and a plastic layer, e.g., polyester film.

A particularly preferred lithographic support is an electrochemically grained and anodized aluminum support. The aluminum is preferably grained by electrochemical graining, and anodized by anodizing techniques employing phosphoric acid or a sulphuric acid/phosphoric acid mixture. Methods of both graining and anodization of aluminum are very well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained.

By anodizing the aluminum support, its abrasion resistance and hydrophilic nature are improved. The microstructure as well as the thickness of the Al$_2$O$_3$ layer are determined by the anodizing step, the anodic weight (g/m$^2$ Al$_2$O$_3$ formed on the aluminum surface) varies between 1 and 8 g/m$^2$.

The grained and anodized aluminum support may be post-treated to improve the hydrophilic properties of its surface. For example, the aluminum oxide surface may be silicated by treating its surface with a sodium silicate solution at elevated temperature, e.g., 95° C. Alternatively, a phosphate treatment may be applied which involves treating the aluminum oxide surface with a phosphate solution that may further contain an inorganic fluoride. Further, the aluminum oxide surface may be rinsed with an organic acid and/or salt thereof, e.g., carboxylic acids, hydrocarboxylic acids, sulphonic acids, or phosphonic acids, or their salts, e.g., succinates, phosphates, phosphonates, sulphates, and sulphonates. A citric acid or citrate solution is preferred. This treatment may be carried out at room temperature or may be carried out at a slightly elevated temperature of about 30° C. to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB 1084070, DE 4423140, DE 4417907, EP 659909, EP 537633, DE 4001466, EP A 292801, EP A 291760, and U.S. Pat. No. 4,458,005.

An optimal ratio between pore diameter of the surface of the aluminum support and the average particle size of the hydrophobic thermoplastic particles may enhance the press life of the printing plate and may improve the toning behavior of the prints. This ratio of the average pore diameter of the surface of the aluminum support to the average particle size of the thermoplastic particles present in the image-recording layer of the coating preferably ranges from 0.05:1 to 0.8:1, more preferably from 0.10:1 to 0.35:1.

According to another preferred embodiment, the support can also be a flexible support, which is provided with a hydrophilic layer, hereinafter called a 'base layer'. The flexible support is, e.g., paper, plastic film, thin aluminum, or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate, or a hydrolyzed tetra-alkylorthosilicate. The latter is particularly preferred. The thickness of the hydrophilic base layer may vary in the range of 0.2 to 25 μm and is preferably 1 to 10 μm. The hydrophilic binder for use in the base layer is, e.g., a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate, or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight. The amount of hardening agent, in particular tetra-alkyl orthosilicate, is preferably at least 0.2 parts per part by weight of hydrophilic binder, more preferably between 0.5 and 5 parts by weight, even more preferably between 1 parts and 3 parts by weight.

According to another preferred embodiment, the base layer may also include Al$_2$O$_3$ and an optional binder. Deposition methods for the Al$_2$O$_3$ onto the flexible support may be (i)

physical vapor deposition including reactive sputtering, RF-sputtering, pulsed laser PVD, and evaporation of aluminum, (ii) chemical vapor deposition under both vacuum and non-vacuum conditions, (iii) chemical solution deposition including spray coating, dipcoating, spincoating, chemical bath deposition, selective ion layer adsorption and reaction, liquid phase deposition, and electroless deposition. The $Al_2O_3$ powder can be prepared using different techniques including flame pyrolisis, ball milling, precipitation, hydrothermal synthesis, aerosol synthesis, emulsion synthesis, sol-gel synthesis (solvent based), solution-gel synthesis (water based), and gas phase synthesis. The particle size of the $Al_2O_3$ powders can vary between 2 nm and 30 μm; more preferably between 100 nm and 2 μm.

The hydrophilic base layer may also contain substances that increase the mechanical strength and the porosity of the layer. For this purpose colloidal silica may be used. The colloidal silica used may be in the form of any commercially available water dispersion of colloidal silica, for example, having a particle size up to 40 nm, e.g., 20 nm. In addition, inert particles of larger size than the colloidal silica may be added, e.g., silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides.

Particular examples of suitable hydrophilic base layers for use in accordance with the preferred embodiments of the present invention are disclosed in EP 601240, GB 1419512, FR 2300354, U.S. Pat. No. 3,971,660, and U.S. Pat. No. 4,284,705.

The coating preferably also contains a compound which absorbs infrared light and converts the absorbed energy into heat. The amount of infrared absorbing agent in the coating is preferably between 0.25 and 25.0% by weight, more preferably between 0.5 and 20.0% by weight. In a preferred embodiment, its concentration is at least 6% by weight, more preferred at least 8% by weight. The infrared absorbing compound can be present in the image-recording layer and/or an optional other layer. Preferred IR absorbing compounds are dyes such as cyanine, merocyanine, indoaniline, oxonol, pyrilium, and squarilium dyes or pigments such as carbon black. Examples of suitable IR absorbers are described in, e.g., EP-A 823327, EP-A 978376, EP-A 1029667, EP-A 1053868, EP-A 1093934, WO 97/39894, and WO 00/29214. A preferred compound is the following cyanine dye IR-1 or a suitable salt thereof:

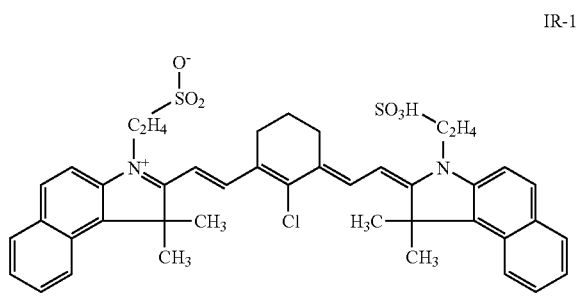

IR-1

To protect the surface of the coating, in particular from mechanical damage, a protective layer may also optionally be applied. The protective layer generally includes at least one water-soluble polymeric binder, such as polyvinyl alcohol, polyvinylpyrrolidone, partially hydrolyzed polyvinyl acetates, gelatin, carbohydrates, or hydroxyethylcellulose, and can be produced in any known manner such as from an aqueous solution or dispersion which may, if required, contain small amounts, i.e., less than 5% by weight, based on the total weight of the coating solvents for the protective layer, of organic solvents. The thickness of the protective layer can suitably be any amount, advantageously up to 5.0 μm, preferably from 0.05 to 3.0 μm, particularly preferably from 0.10 to 1.0 μm.

The coating may in addition to the image-recording layer also contain one or more additional layer(s). Besides the layer including the colloidal silica and the other additional layers already discussed above, i.e., an optional light-absorbing layer including one or more compounds that are capable of converting infrared light into heat and/or a protective layer such as, e.g., a covering layer which is removed during processing, the coating may further include, for example, an adhesion-improving layer between the image-recording layer and the support.

Optionally, the coating may further contain additional ingredients. These ingredients may be present in the image-recording layer or in on optional other layer. For example, additional binders, polymer particles such as matting agents and spacers, surfactants such as perfluoro surfactants, silicon or titanium dioxide particles, development inhibitors, development accelerators or colorants are well-known components of lithographic coatings. Especially addition of colorants such as dyes or pigments which provide a visible color to the coating and remain in the exposed areas of the coating after the processing step, are advantageous. Thus, the image-areas which are not removed during the processing step form a visible image on the printing plate and examination of the developed printing plate becomes feasible. Typical examples of such contrast dyes are the amino-substituted tri- or diaryl-methane dyes, e.g., crystal violet, methyl violet, victoria pure blue, flexoblau 630, basonylblau 640, auramine, and malachite green. Also the dyes which are discussed in depth in the detailed description of EP-A 400,706 are suitable contrast dyes. Dyes which, combined with specific additives, only slightly color the coating but which become intensively colored after exposure, are also of interest.

The printing plate precursor according to a preferred embodiment of the present invention can be image-wise exposed directly with heat, e.g., by a thermal head, or indirectly by infrared light, preferably near infrared light. The infrared light is preferably converted into heat by an IR light absorbing compound as discussed above. The heat-sensitive lithographic printing plate precursor of a preferred embodiment of the present invention is preferably not sensitive to visible light. Most preferably, the coating is not sensitive to ambient daylight, i.e., visible (400-750 nm) and near UV light (300-400 nm) at an intensity and exposure time corresponding to normal working conditions so that the material can be handled without the need for a safe light environment.

The printing plate precursors of the various preferred embodiments of the present invention can be exposed to infrared light by, e.g., LEDs or an infrared laser. Preferably, the light used for the exposure is a laser emitting near infrared light having a wavelength in the range from about 700 to about 1500 nm, e.g., a semiconductor laser diode, a Nd:YAG, or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e., the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters.

ITD plate-setters for thermal plates are typically characterized by a very high scan speed up to 1500 m/sec and may require a laser power of several Watts. The Agfa Galileo T (trademark of Agfa Graphics NV) is a typical example of a plate-setter using the ITD-technology. XTD plate-setters for thermal plates having a typical laser power from about 20 mW to about 500 mW operate at a lower scan speed, e.g., from 0.1 to 20 m/sec. The Creo Trendsetter plate-setter family (trademark of Creo) and the Agfa Xcalibur plate-setter family (trademark of Agfa Graphics NV) both make use of the XTD-technology.

Due to the heat generated during the exposure step, the hydrophobic thermoplastic polymer particles fuse or coagulate so as to form a hydrophobic phase which corresponds to the printing areas of the printing plate. Coagulation may result from heat-induced coalescence, softening, or melting of the thermoplastic polymer particles. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. The coagulation temperature is preferably higher than 50° C., more preferably above 100° C.

After exposure, the precursor can be developed by a suitable processing liquid. In the preferred embodiment where a crosslinking agent is present in the coating, development is not required. In the development step, the non-exposed areas of the image-recording layer are removed without essentially removing the exposed areas, i.e., without affecting the exposed areas to an extent that renders the ink-acceptance of the exposed areas unacceptable. The processing liquid can be applied to the plate, e.g., by rubbing in with an impregnated pad, by dipping, (spin-) coating, spraying, pouring-on, either by hand or in an automatic processing apparatus. The treatment with a processing liquid may be combined with mechanical rubbing, e.g., by a rotating brush. The developed plate precursor can, if required, be post-treated with rinse water, a suitable correcting agent, or preservative as known in the art. During the development step, any water-soluble protective layer present is preferably also removed.

Alternatively, the printing plate precursor can, after exposure, be mounted on a printing press and be developed on-press by supplying ink and/or fountain solution to the precursor.

Suitable processing liquids are plain water or aqueous solutions, e.g., a gumming solution or an alkaline solution. The gum solution which can be used in the development step, is typically an aqueous liquid which includes one or more surface protective compounds that are capable of protecting the lithographic image of a printing plate against contamination or damage. Suitable examples of such compounds are film-forming hydrophilic polymers or surfactants. The gum solution preferably has a pH from 4 to 10, more preferably from 5 to 8. Preferred gum solutions are described in EP 1,342,568.

A preferred embodiment using an alkaline solution is now described in more detail. A preferred developer solution is a developer with a pH of at least 10, more preferably at least 11, even more preferably at least 12. Preferred developer solutions are buffer solutions such as, for example, silicate-based developers or developer solutions including buffers. Silicate-based developers which have a ratio of silicon dioxide to alkali metal oxide of at least 1 are advantageous because they ensure that the alumina layer (if present) of the substrate is not damaged. Preferred alkali metal oxides include $Na_2O$ and $K_2O$, and mixtures thereof. A particularly preferred silicate-based developer solution is a developer solution including sodium or potassium metasilicate, i.e., a silicate where the ratio of silicon dioxide to alkali metal oxide is 1.

In addition to alkali metal silicates, the developer may optionally contain further components, such as buffer substances, complexing agents, antifoams, organic solvents in small amounts, corrosion inhibitors, dyes, surfactants, and/or hydrotropic agents as known in the art.

The development is preferably carried out at temperatures of from 20 to 40° C. in automated processing units as customary in the art. For regeneration, alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. The required amounts of regenerated material must be tailored to the developing apparatuses used, daily plate throughputs, image areas, etc. and are in general from 1 to 50 ml per square meter of plate precursor. The addition of replenisher can be regulated, for example, by measuring the conductivity of the developer as described in EP-A 0,556,690.

The development step may be followed by a rinsing step and/or a gumming step. The gumming step involves post-treatment of the lithographic printing plate with a gum solution as described above.

The plate precursor can, if required, be post-treated with a suitable correcting agent or preservative as known in the art. To increase the resistance of the finished printing plate and hence to extend the run length, the layer can be briefly heated to elevated temperatures ("baking"). The plate can be dried before baking or is dried during the baking process itself. During the baking step, the plate can be heated at a temperature which is higher than the glass transition temperature of the thermoplastic particles, e.g., between 100° C. and 230° C. for a period of 40 minutes to 5 minutes. A preferred baking temperature is above 60° C. For example, the exposed and developed plates can be baked at a temperature of 230° C. for 5 minutes, at a temperature of 150° C. for 10 minutes or at a temperature of 120° C. for 30 minutes. Baking can be done in conventional hot air ovens or by irradiation with lamps emitting in the infrared or ultraviolet spectrum. As a result of this baking step, the resistance of the printing plate to plate cleaners, correction agents, and UV-curable printing inks increases. Such a thermal post-treatment is described, inter alia, in DE 1,447,963 and GB 1,154,749.

The printing plate thus obtained can be used for conventional, so-called wet offset printing, in which ink and an aqueous dampening liquid is supplied to the plate. Another suitable printing method uses so-called single-fluid ink without a dampening liquid. Suitable single-fluid inks have been described in U.S. Pat. Nos. 4,045,232; 4,981,517; and U.S. Pat. No. 6,140,392. In a preferred embodiment, the single-fluid ink includes an ink phase, also called the hydrophobic or oleophilic phase, and a polyol phase as described in WO 00/32705.

EXAMPLES

Example 1

1) Preparation of the Lithographic Support

A 0.28 mm thick aluminum support was degreased by spraying it with an aqueous solution containing 34 g/l of sodium hydroxide at 70° C. for 5.9 s and rinsing it at room temperature for 3.6 s with a solution containing 12.4 g/l of hydrochloric acid and 9 g/l of sulphuric acid diluted with demineralized water until a pH of 2 is obtained.

The aluminum support was then electrochemically grained using an alternating current in an aqueous solution of 15 g/l HCl, 34.7 of g/l $Al_2(SO_4)_3.18H_2O$ and 19.6 g/l of $AlCl_3.6H_2O$ at a temperature of 37° C. using a current density of about 105 $A/dm^2$ and at a total charge density of about 830 Coulomb/$dm^2$.

Subsequently, the support was etched by spraying it with an aqueous solution containing 145 g/l of sulphuric acid at 80° C. for 4.8 s and rinsed with water at room temperature for 3.6 s.

After the etching step, the support was subjected for 9.5 s to an anodic oxidation in an aqueous solution containing 145 g/l of sulphuric acid and 10 g/l of aluminum sulphate at a temperature of 57° C. and a current density of 25 $A/dm^2$. Subsequently, the anodized support was washed with water at room temperature for 6.6 s and subsequently the support was post-anodic treated with 2.2 g/l of polyvinylphosphonic acid for 4.2 at 70° C. and rinsed with water for 3.6 s at room temperature and dried at 120° C. for 7.2 s.

water and was stirred for 24 hours at room temperature resulting in a solution with a solid content of 1% wt.

Preparation of the Polyacrylic Acid Solution

The polyacrylic acid solution was prepared by adding 100 g of Glascol E15 (tradename of Ciba Specialty Chemicals) to 904 g of demineralized water and the solution was stirred for 30 minutes at room temperature. This resulted in a 1.5% wt solution of poly acrylic acid.

Preparation of the Surfactant Solution

The surfactant solution was prepared by adding 50 g of BAYOWET FT248 (trade name of perfluorooctanesulfonic acid tetraethylammonium salt, commercially available from Lanxess) to 475 ml of ethanol (denaturated with 2% methanol) while stirring at room temperature. The mixture was further stirred until a clear solution was obtained and then the solution was diluted with 522 ml of demineralized water and stirred for an additional 15 minutes. This resulted in a 5% solution of the surfactant.

TABLE 1

Composition of the Coating

| INGREDIENTS g | PPP-1 Ref. | PPP-2 Inv. | PPP-3 Inv. | PPP-4 Inv. | PPP-5 Inv. | PPP-6 Inv. | PPP-7 Inv. | PPP-8 Inv. |
|---|---|---|---|---|---|---|---|---|
| Water | 15.47 | 16.88 | 18.26 | 16.89 | 18.26 | 19.66 | 18.25 | 19.64 |
| Styrene/Acrylonitrile Latex (1) | 4.87 | 4.63 | 4.39 | 4.63 | 4.39 | 4.14 | 4.39 | 4.14 |
| IR-2 (2) | 16.04 | 15.21 | 14.43 | 15.21 | 14.43 | 13.64 | 14.43 | 13.64 |
| Polyacrylic acid binder (3) | 13.37 | 12.70 | 12.03 | 12.70 | 12.03 | 11.36 | 12.03 | 11.36 |
| Snowtex OS (4) | — | 0.33 | 0.67 | — | — | — | — | — |
| Snowtex O (4) | — | — | — | 0.33 | 0.66 | 0.99 | — | — |
| Snowtex OL (4) | — | — | — | — | — | — | 0.68 | 1.01 |
| Bayowet FT248 (5) | 0.25 | 0.24 | 0.23 | 0.24 | 0.23 | 0.21 | 0.23 | 0.21 |

(1) Copolymer with weight ratio 60/40, 20% wt dispersion stabilized with an anionic wetting agent; particle size of 55 nm, measured with a Brookhaven BI-90 analyzer, commercially available from Brookhaven Instrument Company, Holtsville, NY, USA;
(2) 1% wt solution of Infrared absorbing dye IR-2 as defined above; preparation of solution as given above;
(3) 1.5% wt solution of Glascol E15 commercially available from Ciba Speciality Chemicals, Mw = 500 000 g/mol, preparation of solution as given above;
(4) acidic amorphous silicon dioxide dispersion in water, 20% wt solid, commercially available form Nissan Chemical, Japan, mean particle size 8-10 nm (Snowtex OS), 10-20 nm (Snowtex O) and 20-21 nm (Snowtex OL);
(5) 5% wt solution of Bayowet FT248, trade name of perfluoro-octanesulfonic acid tetraethylammonium salt, surfactant commercially available from Lanxess; preparation of solution as given above.

2) Preparation of the Printing Plates

The printing plate precursors were prepared by applying an aqueous coating composition at a wet coating thickness of 30 μm onto the above described support. The composition of the coating is defined in Table 1. After coating, the printing plate precursor was dried and a dry coating weight of 0.81 g/m² was obtained.

The Coating Composition was Prepared as Follows

Demineralized water and the styrene/acrylonitrile latex dispersion were stirred for 10 minutes. Subsequently the IR-dye solution was added. After 60 minutes of stirring the polyacrylic acid solution was added. After 10 minutes of stirring Snowtex was added, then the surfactant solution was added and the coating dispersion was stirred for another 30 minutes. The pH of the coating composition was adjusted to a value of 3.6.

Preparation of the Ir-dye Solution

The IR dye solution was prepared by adding 10 g of IR-2 (triethyl ammonium salt of IR-1) to 995 ml of demineralized The printing plate precursors 1-8 were subsequently exposed with a Creo Trendsetter TH5850 (40 W) (platesetter, trademark from Creo, Burnaby, Canada), operating at 150 rpm with a 200 lpi screen and a varying density up to 250 mJ/cm².

3) Print Results

After exposure, the printing plate precursors 1-8 were directly mounted on a Heidelberg GTO46 printing press available from Heidelberger Druckmaschinen AG, Heidelberg, Germany, without any processing step. K+E Novavit 800 Skinnex was used as ink (trademark of BASF Drucksysteme GmbH) and 3% FS101 (trademark of Agfa Graphics NV) in 10% isopropanol as a fountain liquid.

A roll with ink was pressed for 2 minutes against the mounted printing plate resulting in the so-called ink mark on the plate. Then, as a start-up procedure, the press run was started with 5 rotations applying fountain solution followed by 5 rotations applying ink. Subsequently, 1,000 prints were made on 80 g offset paper. The prints were evaluated in terms of ink-mark fading, ink-acceptance, and smallest % dot at 100 mJ/cm² and are summarized in Table 2.

Ink-mark fading is defined as the number of prints needed to have a complete disappearance of the ink mark present on the paper prints. The ink mark is induced by pressing an ink-roll on the printing plate for a period of 2 minutes. During printing, the mark is washed away at the non-image areas and is a measure of clean out. The less prints needed to wash away this ink mark, the better the ink mark fading and the better the clean out behavior of the plate.

Ink-acceptance is defined as the number of prints needed to reach a Dmax value≧1.0 at the image areas. Dmax is measured with a Gretag Macbeth densitometer Type D19C (available from Gretag Macbeth AG).

Smallest dot is defined as the smallest % dot visible upon 8× magnification. The lower the number, the more sensitive the printing plate.

TABLE 2

Print Results

| Printing Plate | Smallest % dot @ 100 mJ/cm² | Ink-mark fading | Ink acceptance |
|---|---|---|---|
| PP-1 (reference) | 3-4 | 100 | 10 |
| PP-2 (inventive) | 3 | 50 | 10 |
| PP-3 (inventive) | 3 | 50 | 10 |
| PP-4 (inventive) | 3 | 25 | 10 |
| PP-5 (inventive) | 2-3 | 50 | 10 |
| PP-6 (inventive) | 2-3 | 50 | 10 |
| PP-7 (inventive) | 3 | 25 | 5 |
| PP-8 (inventive) | 3 | 25 | 5 |

The results in Table 2 show that the ink mark fading was significantly improved by adding Snowtex O/OS/OL to the coating. In addition, the inventive printing plates showed an improved laser sensitivity (lower smallest % dot values) without reducing (or even improving: PP-7 and PP-8) the ink accepting properties.

Example 2

1) Preparation of the Lithographic Support

The support was prepared as in Example 1.

2) Preparation of the Printing Plate Precursors

The printing plate precursors were produced by first applying the coating composition defined in Table 3 onto the above-described lithographic support. The coating was applied at a wet coating thickness of 30 μm and then dried at 60° C. for two minutes. The dry coating weight was 0.81 g/m². The printing plate precursor thus obtained is reference printing plate precursor 9.

Preparation of the First Coating Composition

Demineralized water and the styrene/acrylonitrile latex dispersion are stirred for 10 minutes. Subsequently the IR-2 solution (see Example 1) was added. After 60 minutes of stirring the polyacrylic acid solution (see Example 1) was added and after a further 10 minutes of stirring 5 g of the surfactant solution (see Example 1) was added and the coating dispersion was stirred for another 30 minutes. The pH of the obtained coating was adjusted to a value of 3.6.

TABLE 3

Composition of the First Coating

| Ingredients | G |
|---|---|
| Demineralized water | 310.4 |
| Styrene/acrylonitrile latex (1) | 97.56 |
| IR-2 (2) | 320.4 |
| Polyacrylic acid (3) | 267.0 |
| Bayowet FT248 (4) | 5.0 |

(1) Copolymer with weight ratio 60/40, 20% wt dispersion stabilized with an anionic wetting agent; particle size of 55 nm, measured with a Brookhaven BI-90 analyzer, commercially available from Brookhaven Instrument Company, Holtsville, NY, USA;
(2) 1% wt solution of Infrared absorbing dye IR-2 as defined above, preparation of the solution as given above;
(3) 1.5% wt solution of Glascol E15 commercially available from Ciba Speciality Chemicals, Mw = 500 000 g/mol, preparation of solution as given above;
(4) 5% wt solution of Bayowet FT248, trade name of perfluoro-octanesulfonic acid tetraethylammonium salt, surfactant commercially available from Lanxess, preparation of solution as given above.

Onto the dried coated printing plate precursor, a second coating composition (forming a top layer) as defined in Table 4 was coated at a wet coating thickness of 30 μm. Then the precursor was dried at 40° C. for ten minutes. Printing plate precursors 10-13 were obtained.

TABLE 4

Composition of Second Coating

| Ingredients | PPP-10 | PPP-11 | PPP-12 | PPP-13 |
|---|---|---|---|---|
| Snowtex O (1) | 0.41 g | 0.81 g | — | — |
| Levasil 200 E (2) | — | — | 0.42 g | 0.83 g |
| Demineralized water (3) | Up to 50 ml | Up to 50 ml | Up to 50 ml | Up to 50 ml |

(1) acidic amorphous silicon dioxide dispersion in water, 20% wt solid, commercially available form Nissan Chemical, Japan, mean particle 10-20 nm;
(2) acidic amorphous silicon dioxide dispersion in water, 20% wt solid, commercially available form H.C. Starck GmbH c/o Bayer AG, Leverkusen Germany;
(3) demineralized water was added up to 50 ml solution was obtained.

Reference printing plate precursor 9 (no top layer) and the printing plate precursors 10-13 were then exposed with a CREO platesetter TH5850 (40 W) available from CREO, Burnaby, Canada, with a fast head IR-laser @150 rpm with a 200 lpi screen at varying energy densities up to 250 mJ/m².

3) Print Results

The exposed printing plates were directly mounted on a Heidelberg GTO46 printing press available from Heidelberger Druckmaschinen AG, Heidelberg, Germany, without any processing. K+E Novavit 800 Skinnex was used as ink (trademark of BASF Drucksysteme GmbH) and 3% FS101 (trademark of Agfa Graphics NV) in 10% isopropanol as a fountain liquid.

A roll with ink was pressed for 2 minutes against the mounted printing plate precursors resulting in a so-called ink mark on the plates. Then, as a start-up procedure, the first 5 rotations were provided with the fountain solution and then 5 rotations were provided with the ink. Subsequently, 1,000 prints were made on 80 g offset paper. Table 5 lists the print results in terms of smallest dot, ink-mark fading, and ink-acceptance. Ink-mark fading, ink-acceptance, and smallest dot are as defined above.

TABLE 8

Print Results

| Printing Plates | Smallest % dot @ 150 mJ/cm$^2$ | Ink-mark fading | Ink acceptance |
|---|---|---|---|
| PP-9 (reference) | 2-3 | >100 | 5 |
| PP-10 (inventive) | 2 | 50 | 10 |
| PP-11 (inventive) | 3 | 50 | 50 |
| PP-12 (inventive) | 2 | 50 | 25 |
| PP-13 (inventive) | 3 | 50 | 10 |

The results of Table 8 demonstrate that the presence of a thin top layer including acidic silica particles improves the ink-mark fading and sensitivity (smallest % dot) while the ink acceptance was only slightly reduced.

Example 3

1) Preparation of the Aluminum Support

A 0.28 mm thick aluminum support was degreased by spraying it with an aqueous solution containing 34 g/l of sodium hydroxide at 70° C. for 5.9 s and rinsing it at room temperature for 3.6 s with a solution containing 12.4 g/l of hydrochloric acid and 9 g/l of sulphuric acid diluted with demineralized water until a pH of 2 is obtained.

The aluminum support was then electrochemically grained using an alternating current in an aqueous solution of 12.5 g/l of HCl, 20.8 g/l of Al$_2$(SO$_4$)$_3$.18H$_2$O and 29.6 g/l of AlCl$_3$.6H$_2$O at a temperature of 37° C. and at a anodization charge density of 545 Coulomb/dm$^2$.

Subsequently, the support was etched by spraying it with an aqueous solution containing 145 g/l of sulphuric acid at 80° C. for 4.8 s and rinsed with water at room temperature for 3.6 S.

After the etching step, the support was subjected for 9.5 s to anodic oxidation in an aqueous solution containing 145 g/l of sulphuric acid and 10 g/l of aluminum sulphate at a temperature of 57° C. and a current density of 25 A/dm$^2$. Subsequently, the anodized support was washed with water at room temperature for 6.6 s and subsequently the support was post-anodic treated with 2.2 g/l of polyvinylphosphonic acid for 4.2 s at 70° C. and rinsed with water for 3.6 s at room temperature and dried at 120° C. for 7.2 s.

2) Preparation of the Printing Plate Precursors

The printing plate precursors were prepared by applying an aqueous coating composition as defined in Table 9 onto the above described support at a wet thickness of 35 μm. The coating was dried at 60° C. and a dry coating weight of 1.35 g/m$^2$ was obtained. Before coating, the pH of the coating was adjusted to 4.0. The obtained printing plate precursor was subsequently conditioned for 12 hours at 67° C. and 50% relative humidity. The as such obtained printing plate precursor (thus without including a top layer) is called reference PPP-14.

TABLE 9

Composition of the Coating

| Ingredients | g |
|---|---|
| Demineralized water | 559.40 |
| Styrene/acrylonitrile latex (1) | 95.80 |
| Snowtex O (2) | 23.4 |
| TMOS (3) | 20.8 |
| IR-2 (4) | 163.20 |
| Polyvinyl alcohol (5) | 128.0 |
| Zonyl FSO100 (6) | 9.4 |

(1) Copolymer with weight ratio 60/40, 20% wt dispersion stabilized with an anionic wetting agent; particle size of 55 nm, measured with a Brookhaven BI-90 analyzer, commercially available from Brookhaven Instrument Company, Holtsville, NY, USA;
(2) acidic amorphous silicon dioxide dispersion in water, 20% wt solid, commercially available form Nissan Chemical, Japan, mean particle size 10-20 nm;
(3) 11.3% wt solution of hydrolyzed tetramethoxysilane; preparation see below;
(4) 1% wt solution of Infrared absorbing dye IR-2 as defined above, preparation of the solution as given above;
(5) 7.5% wt solution of polyvinyl alcohol, preparation see below;
(6) 5% wt solution of surfactant, commercially available form Dupont.

Preparation of the Hydrolyzed Tetramethoxysilane Solution (TMOS)

691 kg of tetramethoxysilane was added to a closed reaction vessel with a water-cooled condenser and thermometer, containing 1093 l of ethanol (denatured with 2% methanol) while slowly stirring at a temperature of 20° C. A solution of 1161 l demineralized water and 3390 ml of methanesulfonic acid was prepared and added to the reaction vessel under vigorous stirring. By adding the solution, the temperature increases to 40° C.; then the reaction was kept at 40° C. for an additional 3 hours while stirring slowly. After completion of the reaction, the temperature was adjusted to room temperature for a period of 1 hour. This resulted in a 11.3% solution of hydrolyzed TMOS.

Preparation of the Polyvinyl Alcohol Solution 83 g of Erkol WX48/20 (commercially available from Erkol, part of the Acetex Group) and 968 g of demineralized water were added in a closed reaction vessel with a water-cooled condenser and thermometer. Under continuous stirring, the mixture was heated for 90 minutes at 92° C. and a clear solution was obtained. The solution was cooled to room temperature and the solution was filtered through a 20μ filter. This resulted in a 7.5% wt solution of PVA.

Subsequently, a second layer was coated on top of the printing plate precursor 14; the composition of the second coating composition (forming a top layer) is given in Table 10. These coating compositions were coated at two different wet layer thicknesses: 20 and 40 μm respectively and resulted in PPP-15 to PPP-20 (Table 11). After application of the coating these materials were dried for 10 minutes at 40° C.

TABLE 10

Composition of the Second Coating

| Components | Comp. 1 | Comp. 2 | Comp. 3 |
|---|---|---|---|
| Polyvinyl alcohol (1) | 1.7 g | — | — |
| Snowtex O (2) | — | 0.62 g | — |
| Hydrolyzed TMOS solution (3) | — | — | 1.13 g |
| Zonyl fso 100 (4) | 1 ml | 1 ml | 1 ml |
| Deionized water (5) | Up to 50 ml | Up to 50 ml | Up to 50 ml |

(1) Erkol WX48/20 commercially available from ErKol, Acetex Group, 7.5% wt solution preparation as described above;
(2) 20% wt dispersion with a pH 2-4 commercially available from Nissan Chemical, Japan, average particle size 10-20 nm;
(3) Hydrolyzed teytramethoxysilane, prepared as given above;
(4) Surfactant, commercially available from Dupont;
(5) Demineralized water was added up to a solution of 50 ml was obtained.

TABLE 11

Composition of the Top Layer

| Ingredients (1) g/m² | PPP-15 | PPP-16 | PPP-17 | PPP-18 | PPP-19 | PPP-20 |
|---|---|---|---|---|---|---|
| Polyvinyl alcohol | 0.05 | 0.10 | — | — | — | — |
| Snowtex O | — | — | 0.05 | 0.10 | — | — |
| TMOS | — | — | — | — | 0.05 | 0.10 |
| Zonyl fso 100 | 0.39 | 0.78 | 0.39 | 0.78 | 0.39 | 0.78 |

(1) Ingredients as defined in Table 10

The obtained printing plate precursors were exposed with a Creo S059 40 W fast head IR-laser platesetter at 300 mJ/cm² rpm with a 200 lpi screen.

3. Print Results

The exposed printing plate precursors were directly mounted on a Heidelberg GTO46 printing press available from Heidelberger Druckmaschinen AG, Heidelberg, Germany, without any processing step. Printing was done with fountain Agfa Prima FS101 (trademark of Agfa) and K+E 800 black ink (trademark of K&E). As a start-up procedure, the first 5 rotations were provided with the fountain solution and then 5 rotations were provided with the ink. After that, 1,000 prints were made on 80 g offset paper. The print results in terms of smallest dot (as defined above), clean-out, and scratch sensitivity are summarized in Table 12.

Clean-out behavior is defined as the number of printed pages needed to obtain a Dmin value <0.01 at the non-image areas. Dmin is measured with a Gretag Macbeth densitometer Type D19C (available from Gretag Macbeth AG).

Scratch sensitivity was determined as follows: prior to the print job, the printing plates were scratched at the non-exposed areas using the following test: scratches are formed by displacing bullets of type Mahr 901R with a radius of 1.5 mm at a speed of 96 cm/min, under well defined loads. 10 scratches were formed each under a different load: 20-40-60-80-100-120-140-160-180 and 200 mN. The lowest load under which the scratch becomes visible on print is summarized in Table 12: the higher this load the better the scratch resistance.

TABLE 12

Print Results

| Printing Plate | Clean-out | Smallest % dot @ 300 mJ/cm² | Scratch sensitivity (mN) |
|---|---|---|---|
| PP-14 (reference) | 500 | 2 | 20 |
| PP-15 (comparison) | 50 | 3 | 60 |
| PP-16 (comparison) | 50 | 4 | 80 |
| PP-17 (inventive) | 20 | 2 | 40 |
| PP-18 (inventive) | 15 | 9 | 40 |
| PP-19 (comparison) | 100 | 4 | 20 |
| PP-20 (comparison) | 100 | 3 | 20 |

The results of Table 12 demonstrate that the presence of a thin top layer including acidic silica particles improves the clean-out behavior and decreases the scratch sensitivity, without significantly affecting the sensitivity (smallest % dot values).

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for making a lithographic printing plate precursor comprising the steps of:
   coating an aqueous composition having a pH≦5 on a support having a hydrophilic surface or which is provided with a hydrophilic layer, the aqueous composition including a hydrophilic binder, colloidal silica, and hydrophobic thermoplastic polymer particles stabilized with an anionic dispersant, wherein the silica carries a negative charge; and
   drying the composition thereby obtaining a coating on the support.

2. A method for making a lithographic printing plate precursor comprising the steps of:
   coating a first composition on a support having a hydrophilic surface or a hydrophilic layer, the first composition including a hydrophilic binder, an optional crosslinking agent, and hydrophobic thermoplastic polymer particles stabilized with an anionic dispersant thereby obtaining an image-recording layer;
   coating a second composition on the image-recording layer, the second composition having a pH≦5 and including negatively charged colloidal silica; and
   drying the first and second compositions thereby obtaining a coating on the support.

3. The method according to claim 1, wherein the pH≦4.5.

4. The method according to claim 2, wherein the pH <4.5.

5. The method according to claim 4, wherein the optional crosslinking agent is tetra-alkyl orthosilicate.

6. The method according to claim 1, wherein the colloidal silica is present in the coating in an amount ranging from 0.005 g/m² to 1 g/m².

7. The method according to claim 2, wherein the colloidal silica is present in the coating in an amount ranging from 0.005 g/m² to 1 g/m².

8. The method according to claim 1, wherein the colloidal silica is present in the coating in an amount ranging from 0.01 g/m$^2$ to 0.8 g/m$^2$.

9. The method according to claim 2, wherein the colloidal silica is present in the coating in an amount ranging from 0.01 g/m$^2$ to 0.8 g/m$^2$.

10. The method according to claim 1, wherein the hydrophobic thermoplastic polymer particles have an average particle size in the range from 40 nm to 70 nm.

11. The method according to claim 2, wherein the hydrophobic thermoplastic polymer particles have an average particle size in the range from 40 nm to 70 nm.

12. The method according to claim 1, wherein the amount of the hydrophobic thermoplastic polymer particles in the coating is at least 70% by weight.

13. The method according to claim 2, wherein the amount of the hydrophobic thermoplastic polymer particles in the coating is at least 70% by weight.

14. The method according to claim 1, wherein the hydrophobic thermoplastic polymer particles include at least 5% wt of nitrogen containing units.

15. The method according to claim 2, wherein the hydrophobic thermoplastic polymer particles include at least 5% wt of nitrogen containing units.

16. A method for making a lithographic printing plate comprising the steps of:
    providing a heat-sensitive, negative-working printing plate precursor obtained by the method according to claim 1;
    exposing the coating to heat, thereby inducing coalescence of the thermoplastic polymer particles at exposed areas of the coating; and
    optionally developing the exposed coating with a processing liquid.

17. A method for making a lithographic printing plate comprising the steps of:
    providing a heat-sensitive, negative-working printing plate precursor obtained by the method according to claim 2;
    exposing the coating to heat, thereby inducing coalescence of the thermoplastic polymer particles at exposed areas of the coating; and
    optionally developing the exposed coating with a processing liquid.

18. A method for making a lithographic printing plate comprising the steps of
    providing a heat-sensitive, negative-working printing plate precursor obtained by the method according to claim 1;
    exposing the coating to heat, thereby inducing coalescence of the thermoplastic polymer particles at exposed areas of the coating;
    mounting the exposed precursor on a printing press whereby the precursor is developed by supplying ink and/or fountain solution to the precursor.

19. A method for making a lithographic printing plate comprising the steps of
    providing a heat-sensitive, negative-working printing plate precursor obtained by the method according to claim 2;
    exposing the coating to heat, thereby inducing coalescence of the thermoplastic polymer particles at exposed areas of the coating;
    mounting the exposed precursor on a printing press whereby the precursor is developed by supplying ink and/or fountain solution to the precursor.

* * * * *